(12) United States Patent
Lee et al.

(10) Patent No.: US 8,546,171 B2
(45) Date of Patent: Oct. 1, 2013

(54) METHOD OF FABRICATING THIN FILM SOLAR CELL

(75) Inventors: Hui-Jae Lee, Daejeon (KR); Jong-Il Kim, Gyeonggi-Do (KR); Tae-Kung Yu, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 315 days.

(21) Appl. No.: 13/159,823

(22) Filed: Jun. 14, 2011

(65) Prior Publication Data

US 2011/0312124 A1  Dec. 22, 2011

(30) Foreign Application Priority Data

Jun. 17, 2010  (KR) .................. 10-2010-0057725

(51) Int. Cl.
  *H01L 21/00* (2006.01)
(52) U.S. Cl.
  USPC .................. 438/57; 438/59; 438/62; 438/63; 438/98; 136/243; 136/244; 257/E21.002; 257/E21.599; 257/E31.126
(58) Field of Classification Search
  USPC .......... 438/57, 59, 62–63, 98; 136/243–265; 257/E21.002, E31.126
  See application file for complete search history.

(56) References Cited

U.S. PATENT DOCUMENTS

| | | | | |
|---|---|---|---|---|
| 6,225,552 | B1 * | 5/2001 | Nishi et al. | 136/256 |
| 2009/0194150 | A1 * | 8/2009 | Aoki | 136/252 |
| 2009/0205715 | A1 * | 8/2009 | Yonezawa et al. | 136/265 |
| 2011/0162684 | A1 | 7/2011 | Kim et al. | |

FOREIGN PATENT DOCUMENTS

| | | |
|---|---|---|
| CN | 101527335 A | 9/2009 |
| JP | 2002280579 A | 9/2002 |
| KR | 1020090014450 A | 2/2009 |

OTHER PUBLICATIONS

First Notification of Office Action dated Apr. 2, 2013 from the State Intellectual Property Office of China in counterpart Chinese application No. 201110159536.4.

\* cited by examiner

*Primary Examiner* — Mohsen Ahmadi
(74) *Attorney, Agent, or Firm* — Morgan, Lewis & Bockius LLP

(57) ABSTRACT

Disclosed is a method of fabricating a thin film solar cell. A separation process ('P4' process) of insulating a thin film solar cell from the outside is integrally performed with a transparent electrode patterning process ('P1' process) and a metallic electrode patterning process ('P3' process). This may reduce the fabrication costs and enhance spatial efficiency as the 'P4' process and equipment for the 'P4' process are not required.

4 Claims, 8 Drawing Sheets

METHOD OF FABRICATING THIN FILM SOLAR CELL

CROSS-REFERENCE TO RELATED APPLICATION

Pursuant to 35 U.S.C. §119(a), this application claims the benefit of earlier filing date and right of priority to Korean Application No. 10-2010-0057725, filed on Jun. 17 2010, the contents of which is incorporated by reference herein in its entirety.

BACKGROUND OF THE INVENTION

1. Field of the Invention

This specification relates to a method of fabricating a thin film solar cell, and particularly, to a method of fabricating a thin film solar cell capable of reducing the fabrication costs and enhancing spatial efficiency.

2. Description of the Related Art

Generally, a solar cell is a device for converting solar energy into electrical energy. This solar energy has a junction between a p-type semiconductor and an n-type semiconductor, and has the same basic structure as a diode.

An operation of this solar cell will be explained as follows.

Generally, the solar cell consists of a PN junction diode of a large area. For photovoltaic energy conversion, the solar cell is required to have a condition that electrons are asymmetrically disposed in a semiconductor structure. More concretely, a p-type semiconductor region has a low electron density and a high hole density, and an n-type semiconductor region has a high electron density and a low hole density. Accordingly, a PN junction diode in a thermal equilibrium state has unbalanced charges due to diffusion by a concentration gradient. This may cause formation of an electric field, thereby resulting in no diffusion of carriers. When light having energy more than a band gap (an energy difference between a conduction band and a valence band) is applied to the diode, electrons having received the light energy become excited from the valence band to the conduction band. The electrons which have become excited to the conduction band freely move, and holes are generated at positions of the valence band, the positions from which the electrons have passed out. This is called 'excess carriers', and these 'excess carriers' are diffused in the conduction band or the valence band due to a concentration difference. Here, electrons which have become excited in a p-type semiconductor and holes formed in an n-type semiconductor are called 'minority carriers', respectively. On the other hand, the existing carriers inside the p-type or n-type semiconductor before a junction (holes of the p-type semiconductor and electrons of the n-type semiconductor) are called 'majority carriers'.

The 'majority carriers' are hindered from moving due to an energy barrier which occurs by an electric field. However, the electrons, the 'minority carriers' of the p-type semiconductor can move to the n-type semiconductor, respectively.

A potential drop is generated inside the PN junction diode due to diffusion of the minority carriers. And, the PN junction diode may serve as a solar cell when an electromotive force generated from two ends of the PN junction diode is connected to an external circuit.

The solar cell may be largely categorized into a silicon-based solar cell, a compound-based solar cell and an organic-based solar cell according to a used material.

The silicon-based solar cell is categorized into a monocrystalline silicon-based solar cell, a polycrystalline silicon-based solar cell and an amorphous silicon-based solar cell according to a phase of a semiconductor.

The solar cell is also categorized into a bulk-type solar cell and a thin film solar cell according to a thickness of a semiconductor layer. A thickness of a semiconductor layer of the thin film solar cell corresponds to several μm-several tens of μm.

Among these various types of solar cells, a bulk-type solar cell having high energy conversion efficiency and low fabrication costs is being widely utilized for terrestrial electricity.

However, according to recent high demands for the bulk-type solar cell, raw materials of the bulk-type solar cell become deficient. This may cause the bulk-type solar cell to have a high price.

For low fabrication costs and massive productions of the solar cell for terrestrial electricity, required is a thin film solar cell capable of reducing the amount of a raw material, silicon into 1/100 of the currently-used amount.

The thin film solar cell has an advantage that a large area is implemented more easily than the bulk-type solar cell. However, the thin film solar cell has a disadvantage that energy conversion efficiency is degraded as an area is increased due to a resistance of a transparent electrode of a light receiving surface.

In order to solve this problem, an integrated-type thin film solar cell has been developed. The integrated-type thin film solar cell has a structure in which a transparent electrode is divided into a plurality of strip-shaped electrodes, and unit cells formed on the electrodes are connected to each other in series. Under this structure, power loss due to a resistance of the transparent electrode may be reduced. Furthermore, in case of fabricating the integrated-type thin film solar cell in a large area, degradation of conversion efficiency may be reduced.

Hereinafter, a general thin film solar cell will be explained in more details with reference to the attached drawings.

FIG. 1 is a sectional view schematically illustrating a thin film solar cell in accordance with the related art.

As shown, a general thin film solar cell consists of a plurality of unit cells connected to each other in series. Each unit cell consists of a substrate, a transparent electrode 12 formed on the substrate 10, a semiconductor layer 13 formed on the transparent electrode 12 and formed of amorphous silicon, and a metallic electrode 14 formed on the semiconductor layer 13.

The transparent electrode 12 is formed of a Transparent Conductive Oxide (TCO) for transmittance of solar light incident from the outside through the substrate 10.

The semiconductor layer 13 has a pin structure including a p-type silicon layer formed on the transparent electrode 12, an intrinsic silicon layer formed on the p-type silicon layer, and an n-type silicon layer formed on the intrinsic silicon layer.

Hereinafter, processes of fabricating the thin film solar cell will be explained.

Firstly, a transparent electrode forming thin film, a semiconductor layer forming thin film and a metallic electrode forming thin film are deposited on a substrate. Then, a transparent electrode 12, a semiconductor layer 13 and a metallic electrode 14 are formed by a laser scribing process, respectively. Reference numeral H3 indicates a slot formed by a laser scribing process for patterning of the metallic electrode 14. And, reference numeral H4 indicates a slot formed to expose the substrate 10 along four surfaces of an outer periphery portion of the thin film solar cell for insulation of the thin film solar cell from the outside.

Among various methods for forming unit cells in fabricating the thin film solar cell, the aforementioned laser scribing process is being spotlighted in the aspect of efficiency and production costs.

FIGS. 2A to 2D are sectional views sequentially illustrating processes of fabricating the thin film solar cell of FIG. 1.

As shown in FIG. 2A, a transparent electrode forming thin film is formed on a transparent substrate 10. Then, first slots (H1) are formed in the transparent electrode forming thin film by using a laser irradiation device. As a result, transparent electrodes 12 are formed in respective cells so as to be spacing from each other ('P1' process).

As shown in FIG. 2B, a semiconductor layer forming thin film is formed on the transparent substrate 10 having the transparent electrodes 12 formed thereon. Then, second slots (H2) are formed in the semiconductor layer forming thin film by using a laser irradiation device. As a result, semiconductor layers 13 are formed in respective cells so as to be spacing from each other ('P2' process).

As shown in FIG. 2C, a metallic electrode forming thin film is formed on the transparent substrate 10 having the semiconductor layers 13 formed thereon. Then, metallic electrodes 14 of a left cell (refer to FIG. 2C) are connected to the transparent electrodes 12 of a right cell (refer to FIG. 2C). Then, third slots (H3) are formed in the semiconductor layers 13 and the metallic electrode forming thin film by using a laser irradiation device. As a result, metallic electrodes 14 are formed in respective cells so as to be spacing from each other ('P3' process).

As shown in FIG. 2D, laser irradiation is performed along four surfaces of an outer periphery portion of the thin film solar cell where the metallic electrodes 14 have been formed, thereby removing the transparent electrodes 12, the semiconductor layers 13 and the metallic electrodes 14 on the substrate 10. As a result, formed are fourth slots (H4) for insulating the thin film solar cell from the outside ('P4' process).

Among various methods for forming unit cells in fabricating the thin film solar cell, the aforementioned laser scribing process is being spotlighted in the aspect of efficiency and production costs.

However, the laser scribing process may have the following disadvantages. More concretely, each process requires separate equipment, and is the 'P4' process is requires additional equipment. This may increase installation costs and lower spatial efficiency due to added equipment.

SUMMARY OF THE INVENTION

Therefore, an aspect of the detailed description is to provide a method of fabricating a thin film solar cell capable of reducing fabrication costs and enhancing spatial efficiency by improving the conventional laser scribing process.

To achieve these and other advantages and in accordance with the purpose of this specification, as embodied and broadly described herein, there is provided a method of fabricating a thin film solar cell, the method comprising: providing a substrate having a plurality of cells allocated thereon; depositing a thin film for forming transparent electrodes on the substrate; forming first slots in the thin film for forming transparent electrodes through laser irradiation thereby forming transparent electrodes in respective cells so as to be spacing from each other, and forming primary fourth slots through which a surface of the substrate is exposed; depositing a thin film for forming semiconductor layers on the substrate having the transparent electrodes formed thereon; forming second slots in the thin film for forming semiconductor layers through laser irradiation, thereby forming semiconductor layers in respective cells so as to be spacing from each other; forming a thin film for forming metallic electrodes on the substrate having the semiconductor layers formed thereon; and forming third slots in the thin film for forming metallic electrodes through laser irradiation thereby forming metallic electrodes in respective cells so as to be spacing from each other, and exposing the surface of the substrate including the primary fourth slots thereby forming secondary fourth slots which insulates the plurality of cells from outside.

The present invention may have the following advantages.

As aforementioned, in the method of fabricating a thin film solar cell according to the present invention, a separation process ('P4' process) of insulating a thin film solar cell from the outside may be integrally performed with a transparent electrode patterning process ('P1' process) and a metallic electrode patterning process ('P3' process). This may require no 'P4' process and equipment for the 'P4' process. As a result, the costs to purchase and manage the equipment may be reduced, and spatial efficiency may be enhanced.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a method of fabricating a thin film solar cell according to the present invention will be explained in more details with reference to the attached drawings.

Figure 1:
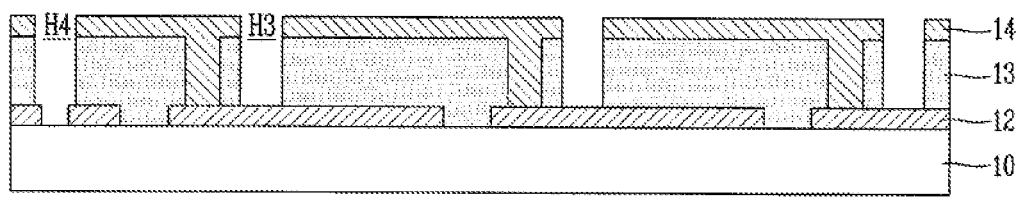
FIG. 1 is a sectional view schematically illustrating a thin film solar cell in accordance with the related art.
Figure 2A:
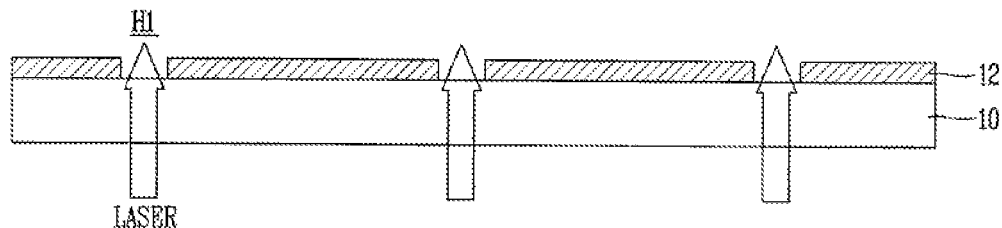
FIGS. 2A to 2D are sectional views sequentially illustrating processes of fabricating the thin film solar cell of FIG. 1.
Figure 2B:
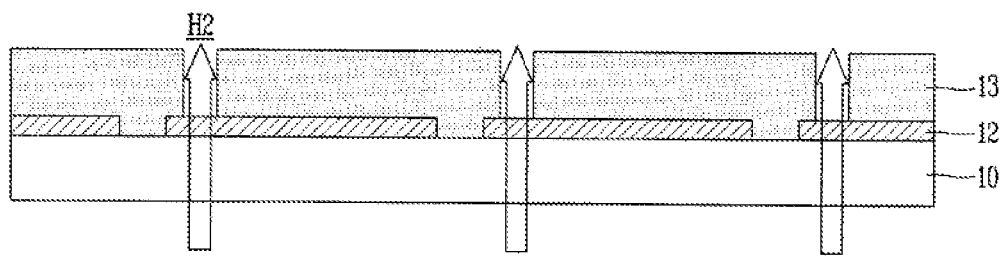
Figure 2C:
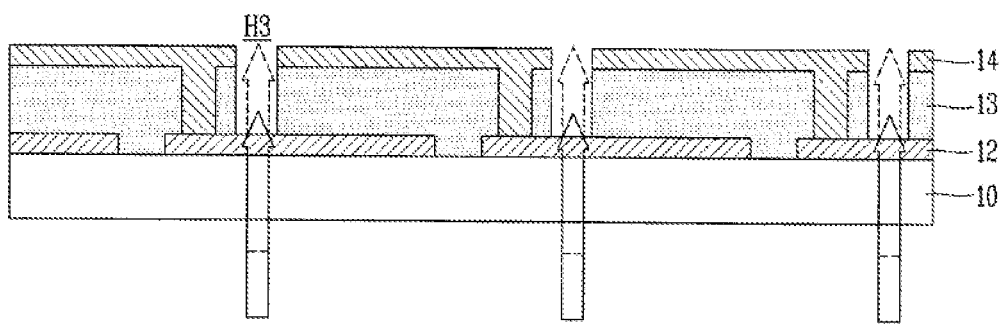
Figure 2D:
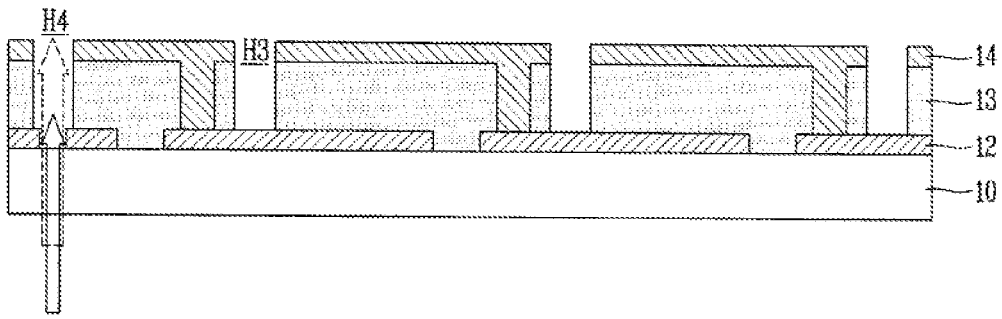
Figure 3:
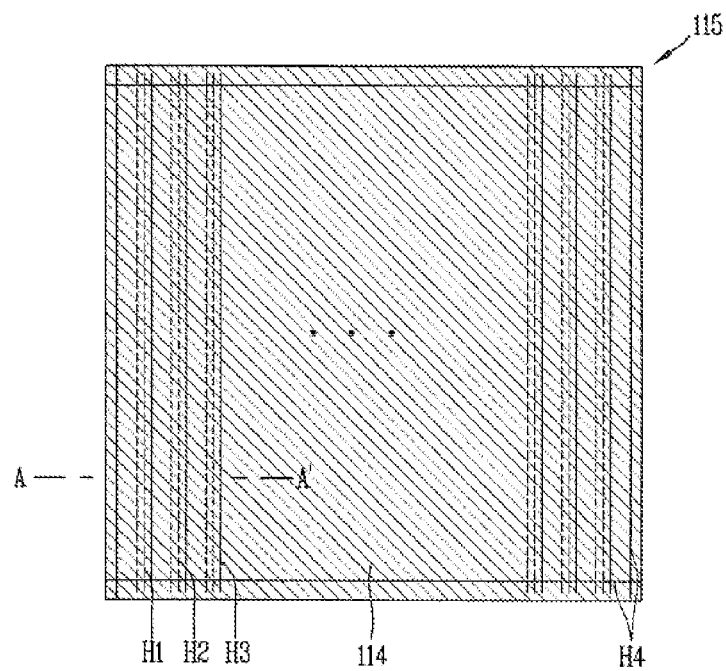
FIG. 3 is a planar view schematically illustrating a structure of a thin film solar cell according to the present invention.
Figure 4:
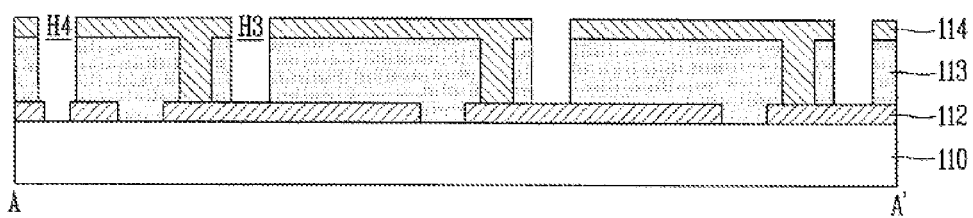
FIG. 4 is a view schematically illustrating a sectional structure taken along line A-A' of the thin film solar cell of FIG. 3.

FIG. 3 is a planar view schematically illustrating a structure of a thin film solar cell according to the present invention, and FIG. 4 is a view schematically illustrating a sectional structure taken along line A-A' of the thin film solar cell of FIG. 3. The thin film solar cell according to the present invention has a structure in which a plurality of strip-shaped unit cells are connected to each other in series.

As shown, a solar cell 115 according to the present invention has a modularized structure in which a plurality of unit cells are connected to each other in series on a glass substrate or a transparent plastic substrate 110.

A module of the thin film solar cell 115 according to the present invention consists of a transparent electrode 112 formed on a substrate 110, an insulation body in the form of insulated strips, a unitary semiconductor layer 113 formed to have a strip shape and covering the transparent electrode 112, and a metallic electrode 114 formed to have a strip shape and covering the semiconductor layer 113. A plurality of insulated unit cells are connected to each other in series. For protection of electrical shortage of the thin film solar cell 115, a passivation layer (not shown) formed of resin may be disposed on the metallic electrode 114.

Here, the transparent electrode 112 is formed of a transparent conductive oxide so that solar light incident from outside through the substrate 110 can be transmitted.

For instance, the semiconductor layer 113 may have a pin structure including a p-type silicon layer formed on the transparent electrode 112, an intrinsic silicon layer formed on the p-type silicon layer, and an n-type silicon layer formed on the intrinsic silicon layer.

The thin film solar cell 115 according to the present invention has a structure in which a plurality of strip-shaped unit cells formed of the transparent electrode 112, the semiconductor layer 113 and the metallic electrode 114 laminated on the substrate 110 are connected to each other in series.

In order to divide the thin film solar cell 115 of the present invention into a is plurality of unit cells, may be used a laser scribing process, a chemical vaporization machining (CVM) method, a mechanical scribing method using a metallic needle, etc.

Hereinafter, processes of fabricating the thin film solar cell 115 will be explained. Firstly, a transparent electrode forming thin film, a semiconductor layer forming thin film and a metallic electrode forming thin film are deposited on a substrate. Then, a transparent electrode 112, a semiconductor layer 113 and a metallic electrode 114 are patterned by laser scribing, respectively. Reference numerals H1, H2 and H3 indicate slots formed by laser scribing processes ('P1', 'P2' and 'P3' processes) for patterning of the transparent electrode 112, the semiconductor layer 113 and the metallic electrode 114, respectively. Reference numeral H4 indicates a slot formed to expose the substrate 110 along four surfaces of an outer periphery portion of the thin film solar cell 115 for insulation of the thin film solar cell 115 from the outside.

A separation process ('P4' process) of insulating the thin film solar cell 115 from the outside is integrally performed with the 'P1' process and the 'P3' process. This may reduce the fabrication costs and enhance spatial efficiency as the 'P4' process and equipment for the 'P4' process are not required. This will be explained in more details through the following processes of fabricating a thin film solar cell.

Figure 5A:
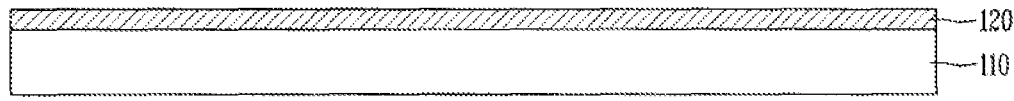
FIGS. 5A to 5F are sectional views sequentially illustrating processes of fabricating the thin film solar cell of FIG. 4 according to the present invention.
Figure 5B:
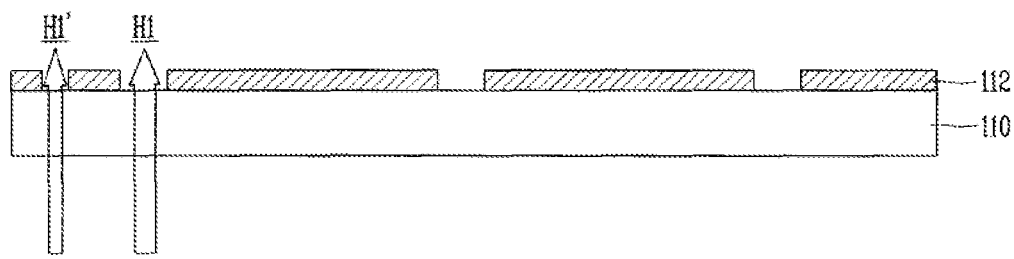
Figure 5C:
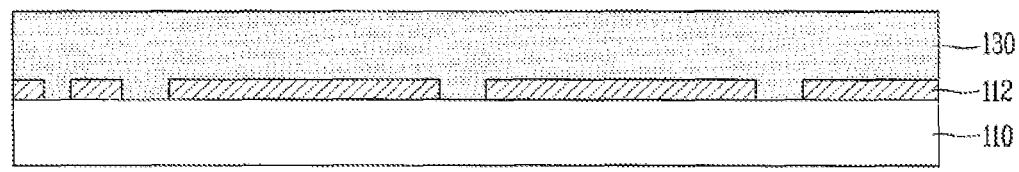
Figure 5D:
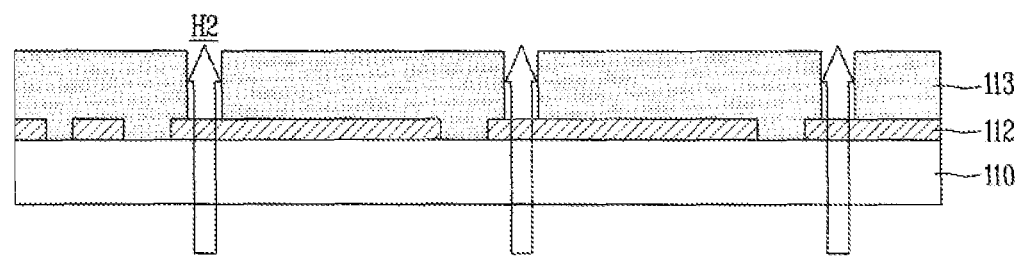
Figure 5E:
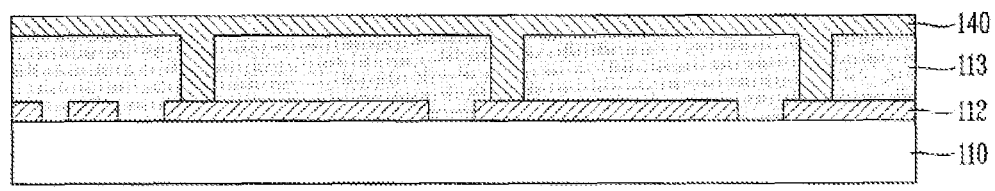
Figure 5F:
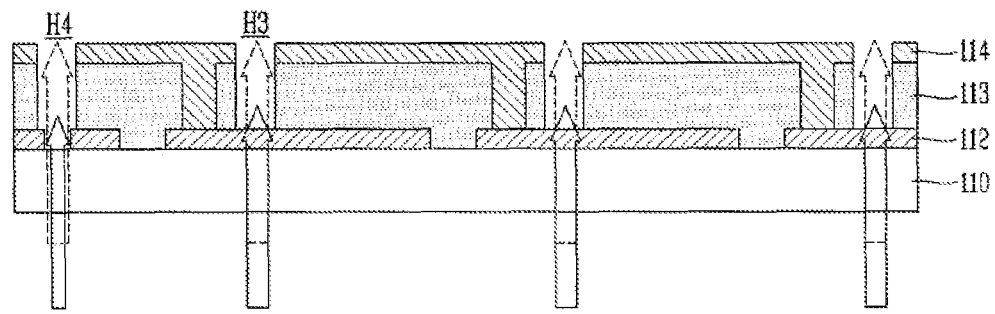
Figure 6A:
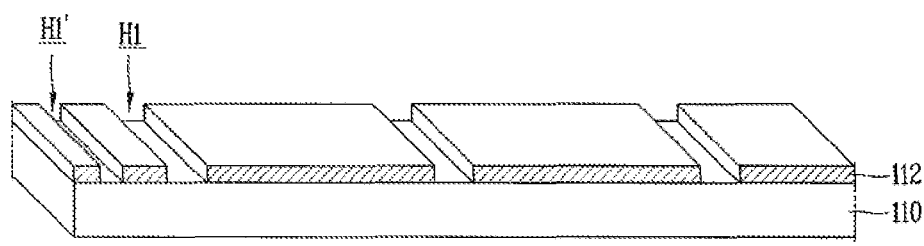
FIGS. 6A to 6C are perspective views sequentially illustrating processes of fabricating the thin film solar cell of FIG. 4 according to the present invention.
Figure 6B:
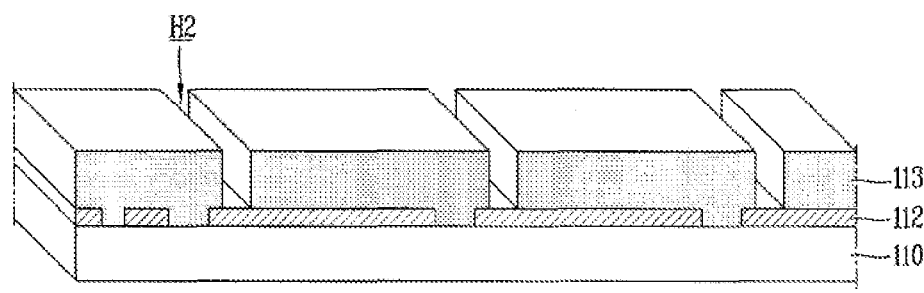
Figure 6C:
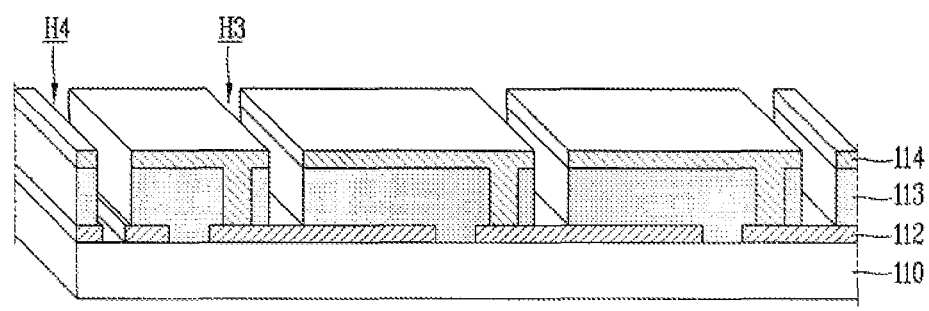
Figure 7A:
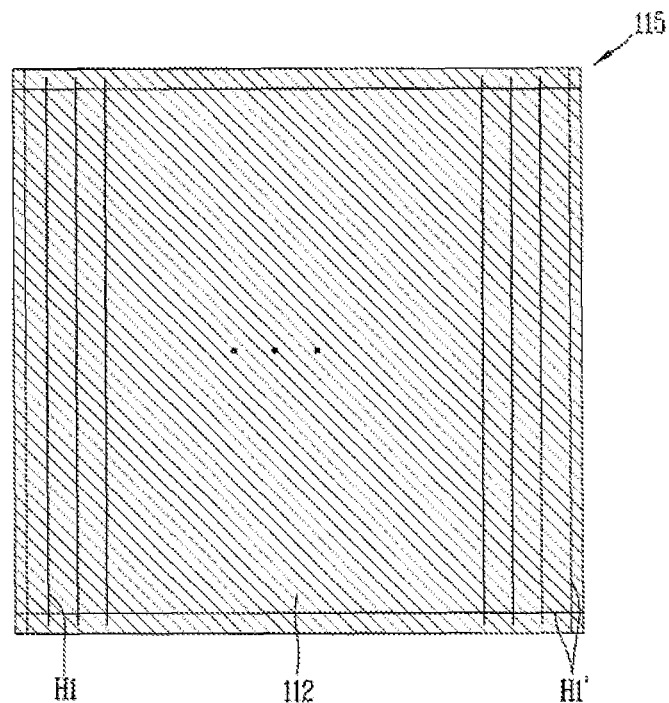
FIGS. 7A to 7C are planar views sequentially illustrating processes of fabricating the thin film solar cell of FIG. 3 according to the present invention.
Figure 7B:
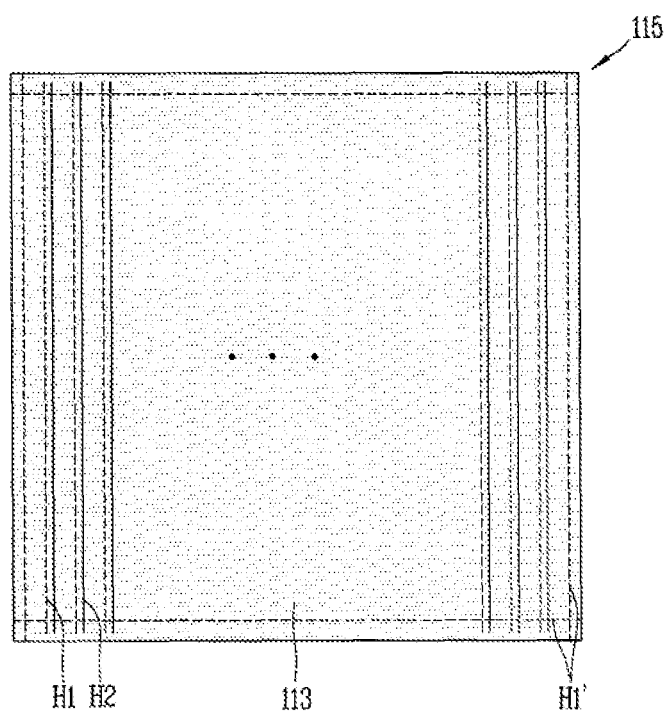
Figure 7C:
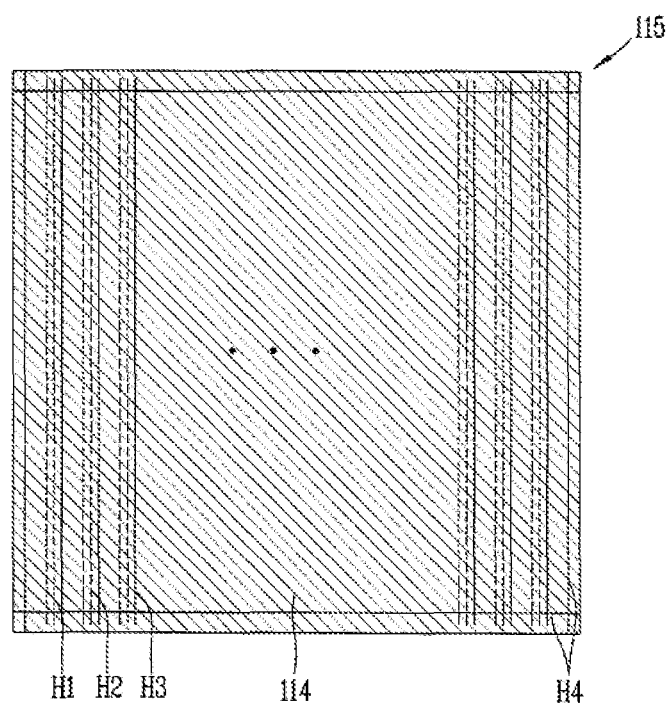

FIGS. 5A to 5F are sectional views sequentially illustrating processes of fabricating the thin film solar cell of FIG. 4 according to the present invention, FIGS. 6A to 6C are perspective views sequentially illustrating processes of fabricating the thin film solar cell of FIG. 4 according to the present invention, and FIGS. 7A to 7C are planar views sequentially illustrating processes of fabricating the thin film solar cell of FIG. 3 according to the present invention.

As shown in FIG. 5A, prepared is a transparent substrate 110 on which a plurality of cells are allocated. Then, a transparent electrode forming thin film 120 is formed on the substrate 110. The transparent electrode forming thin film 120 is preferably formed of a material having properties of conductivity and transmittance. For instance, the transparent electrode forming thin film 120 is formed of a transparent conductive oxide.

As shown in FIGS. 5B, 6A and 7A, first slots (H1) are formed in predetermined regions of the transparent electrode forming thin film 120 through a laser irradiation device below the substrate 110. Then, transparent electrodes 112 are formed in respective cells so as to be separated from each other ('P1' process). Here, the transparent electrode forming thin film is removed along four surfaces of an outer periphery portion of the thin film solar cell 115 in the 'P1' process, thereby forming primary fourth slots (H1') through which the surface of the substrate 110 is exposed. The primary fourth slots (H1') may be simultaneously formed with the first slots (H1) through the laser irradiation device used in the 'P1' process. And, the primary fourth slots (H1') may be formed to expose the surface of the substrate 110 for insulation of the thin film solar cell 115 from the outside, and may be formed to cross each other on four surfaces of the outer periphery portion of the thin film solar cell 115.

Once lasers having wavelengths of 355 nm and 1064 nm are irradiated onto predetermined regions of the transparent electrode forming thin film, parts of the transparent electrode forming thin film undergo a phase change into a solid state, a liquid state and a gaseous state, sequentially (or direct sublimation into a gaseous state without undergoing a liquid state). Then, the transparent electrode is forming thin film is removed as materials thereof are exploded up when a temperature thereof is too high to endure a pressure of gas. This may result in forming the first slots (H1) and the primary fourth slots (H1') through which parts of the substrate 110 are exposed, on laser-irradiated regions. As a result, the transparent electrodes 112 spacing from each other are formed in the respective cells.

As shown in FIG. 5C, a semiconductor layer forming thin film 130 is formed on the substrate 110 having the transparent electrodes 112 formed thereon. The semiconductor forming thin film 130 may be formed of various materials. For instance, the semiconductor forming thin film 130 may be formed of amorphous silicon. In this case, the semiconductor forming thin film 130 may have a pin structure including a p-type silicon thin film formed on the transparent electrode 112, an intrinsic silicon thin film formed on the p-type silicon thin film, and an n-type silicon thin film formed on the intrinsic silicon thin film.

In the present invention, the semiconductor layer forming thin film 130 is formed not only in the first slots (H1), but also in the primary fourth slots (H1').

As shown in FIGS. 5D, 6B and 7B, second slots (H2) are formed in predetermined regions of the semiconductor layer forming thin film 130 through a laser irradiation device below the substrate 110. Then, semiconductor layers 113 are formed in respective cells so as to be spacing from each other ('P2' process).

Once a laser having a wavelengths of 532 nm is irradiated onto predetermined regions of the semiconductor layer forming thin film, parts of the semiconductor layer forming thin film undergo a phase change into a solid state, a liquid state and a gaseous state, sequentially (or direct sublimation into a gaseous state without undergoing a liquid state). Then, the semiconductor layer forming thin film is removed as materials thereof are exploded up when a temperature thereof is too high to endure a pressure of gas. This may result in forming the second slots (H2) through which parts of the transparent electrode 112 are exposed, on laser-irradiated regions. As a result, the semiconductor layers 113 spacing from each other are formed in the respective cells.

As shown in FIG. 5E, a metallic electrode forming thin film 140 is formed on the substrate 110 having the semiconductor layers 113 formed thereon. The metallic electrode forming thin film 140 formed on the substrate 110 is electrically connected to the transparent electrodes 112 disposed in the respective cells through the second slots.

Preferably, the metallic electrode forming thin film 140 is formed of a conductive metallic material. And, the metallic electrode forming thin film 140 may not have a function to transmit solar light therethrough.

As shown in FIGS. 5F, 6C and 7C, third slots (H3) are formed in predetermined regions of the semiconductor layers 113 and the metallic electrode forming thin film 130 through a laser irradiation device below the substrate 110. Then, metallic electrodes 114 are formed in respective cells so as to be separated from each other ('P3' process).

In the present invention, secondary fourth slots (H4) through which the surface of the substrate 110 is exposed are formed by irradiating a laser to the semiconductor layers 113 of the primary fourth slots and the metallic electrode forming thin film formed on the semiconductor layers 113, through the 'P3' process. Here, the secondary fourth slots (H4) may be simultaneously formed with the third slots (H3) through the laser irradiation device used in the 'P3' process. Like the primary fourth slots (H1'), the secondary fourth slots (H4) may be formed to expose the surface of the substrate 110 for insulation of the thin film solar cell 115 from the outside, and may be formed to cross each other on four surfaces of the outer periphery portion of the thin film solar cell 115.

Once lasers having wavelengths of 532 nm, 355 nm and 1064 nm are sequentially irradiated onto predetermined regions of the semiconductor layers 113 and the metallic electrode forming thin film, parts of the semiconductor layers 113 and the metallic electrode forming thin film undergo a phase change into a solid state, a liquid state and a gaseous state, sequentially (or direct sublimation into a gaseous state without undergoing a liquid state). Then, the semiconductor layers 113 and the metallic electrode forming thin film are removed as materials thereof are exploded up when temperatures thereof are too high to endure a pressure of gas. This may result in forming the third slots (H3) through which parts of the transparent electrodes 112 are exposed and the secondary fourth slots (H4) through which the surface of the substrate 110 is exposed, on laser-irradiated regions. As a result, the metallic electrodes 114 spacing from each other and electrically connected to the adjacent transparent electrodes 112 are formed in the respective cells.

A separation process ('P4' process) of insulating the thin film solar cell 115 from the outside is integrally performed with the 'P1' process and the 'P3' process. This may reduce the fabrication costs and enhance spatial efficiency as the 'P4' process and equipment for the 'P4' process are not required.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method of fabricating a thin film solar cell, the method comprising:

providing a substrate having a plurality of cells allocated thereon;

depositing a transparent conductive thin film on the substrate;

simultaneously forming a plurality of first slots and a primary fourth slot at a peripheral location in the transparent conductive thin film of the thin film solar cell through a first laser irradiation thereby forming transparent electrodes in respective cells so as to be spaced from each other, wherein the transparent conductive thin film is removed along four surfaces of an outer periphery portion of the thin film solar cell, thereby forming the primary fourth slot, the first slots and the primary fourth slot exposing a surface of the substrate;

depositing a semiconductor thin film on the transparent electrodes including the first slots, and the primary fourth slot;

forming a plurality of second slots in the semiconductor thin film through a second laser irradiation to form semiconductor patterned layers in respective cells so as to be spaced from each other, the second slots being disposed at locations different than the locations of the first slots and the primary fourth slot;

depositing a metallic thin film on the semiconductor patterned layers and in the plurality of second slots so as to be electrically connected to the transparent electrodes disposed in the respective cells through the plurality of second slots;

forming a plurality of third slots, at locations different than the first slot, the second slots and the primary fourth slot, in the semiconductor patterned layers and the metallic thin film through a third laser irradiation device below the substrate such that the metallic electrodes are formed in respective cells so as to be separated from each other; and forming a secondary fourth slot at the same peripheral location as the primary fourth slot to expose the surface of the substrate by irradiating a laser to the semiconductor patterned layers and the metallic thin film formed on the semiconductor patterned layers using the same laser irradiation device as forming the third slots;

wherein the secondary fourth slot is formed simultaneously with the third slots through the same laser irradiation device used in the process of forming the third slots, wherein the secondary fourth slot formed to expose the surface of the substrate for insulation of the thin film solar cell from the outside, and wherein the primary fourth slot and secondary fourth slot are formed along four surfaces of the outer periphery portion of the thin film solar cell, and wherein a process of insulating the thin film solar cell from the outside is integrally performed with the processes of forming a plurality of first slots and the primary fourth slot.

2. The method of claim 1, wherein the first slots and the primary fourth slots are formed by using lasers having wavelengths of 355 nm and 1064 nm.

3. The method of claim 1, wherein the second slots are formed by using a laser having a wavelength of 532 nm.

4. The method of claim 1, wherein the third slots and the secondary fourth slots are formed by using lasers having wavelengths of 532 nm, 355 nm and 1064 nm.

* * * * *